United States Patent
Huang et al.

(10) Patent No.: US 10,038,025 B2
(45) Date of Patent: Jul. 31, 2018

(54) VIA SUPPORT STRUCTURE UNDER PAD AREAS FOR BSI BONDABILITY IMPROVEMENT

(71) Applicant: Taiwan Semiconductor Manufacturing Co., Ltd., Hsin-Chu (TW)

(72) Inventors: Sin-Yao Huang, Tainan (TW); Ching-Chun Wang, Tainan (TW); Dun-Nian Yaung, Taipei (TW); Feng-Chi Hung, Chu-Bei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/380,186

(22) Filed: Dec. 15, 2016

(65) Prior Publication Data

US 2017/0186802 A1 Jun. 29, 2017

Related U.S. Application Data

(60) Provisional application No. 62/272,138, filed on Dec. 29, 2015.

(51) Int. Cl.
*H01L 21/44* (2006.01)
*H01L 27/146* (2006.01)

(52) U.S. Cl.
CPC .. *H01L 27/14636* (2013.01); *H01L 27/14689* (2013.01)

(58) Field of Classification Search
None
See application file for complete search history.

(56) References Cited

U.S. PATENT DOCUMENTS

| 7,932,170 B1 * | 4/2011 | Huemoeller ........ H01L 21/4853 257/737 |
| 8,502,335 B2 * | 8/2013 | Tseng ...................... H01L 24/05 257/447 |
| 8,748,305 B2 | 6/2014 | Chen |

(Continued)

FOREIGN PATENT DOCUMENTS

| CN | 102130094 A | 7/2011 |
| JP | 2005123587 A | 5/2005 |
| JP | 2010199602 A | 9/2010 |

*Primary Examiner* — Thao P Le
(74) *Attorney, Agent, or Firm* — Eschweiler & Potashnik, LLC (57) ABSTRACT

Some embodiments of the present disclosure relate to an integrated chip having a via support structure underlying a bond pad. The integrated chip has an image sensing element arranged within a substrate. A bond pad region extends through the substrate, at a location laterally offset from the image sensing element, to a first metal interconnect wire arranged within a dielectric structure along a front-side of the substrate. A bond pad is arranged within the bond pad region and contacts the first metal interconnect wire. A via support structure is arranged within the dielectric structure and has one or more vias that are separated from the bond pad by the first metal interconnect wire. One or more additional vias are arranged within the dielectric structure at a location laterally offset from the bond pad region. The one or more vias have larger sizes than the one or more additional vias.

20 Claims, 9 Drawing Sheets

(56) References Cited

U.S. PATENT DOCUMENTS

| | | |
|---|---|---|
| 9,013,022 B2 | 4/2015 | Lin et al. |
| 9,287,318 B2 | 3/2016 | Sekine |
| 9,490,292 B1* | 11/2016 | Yap .................. H01L 27/14652 |
| 2005/0067707 A1 | 5/2005 | Hashimoto et al. |
| 2007/0182001 A1 | 8/2007 | Kanzaki et al. |
| 2008/0284026 A1 | 11/2008 | Hashimoto et al. |
| 2010/0155960 A1 | 6/2010 | Kanzaki et al. |
| 2010/0263913 A1 | 10/2010 | Daubenspeck et al. |
| 2011/0024866 A1* | 2/2011 | Tseng ..................... H01L 24/05 257/459 |
| 2011/0024867 A1 | 2/2011 | Tseng et al. |
| 2012/0313207 A1* | 12/2012 | Oganesian .............. H01L 24/19 257/433 |
| 2013/0009270 A1* | 1/2013 | Tsai .................. H01L 27/14623 257/459 |
| 2013/0134543 A1 | 5/2013 | Tseng et al. |
| 2013/0328151 A1* | 12/2013 | Kao .................. H01L 27/14636 257/443 |
| 2016/0379962 A1* | 12/2016 | Huang .............. H01L 27/14636 257/459 |

* cited by examiner

VIA SUPPORT STRUCTURE UNDER PAD AREAS FOR BSI BONDABILITY IMPROVEMENT

REFERENCE TO RELATED APPLICATION

This Application claims priority to U.S. Provisional Application No. 62/272,138 filed on Dec. 29, 2015, the contents of which is hereby incorporated by reference in its entirety.

BACKGROUND

Integrated circuits (IC) with image sensors are used in a wide range of modern day electronic devices, such as cameras and cell phones, for example. In recent years, complementary metal-oxide semiconductor (CMOS) image sensors have began to see widespread use, largely replacing charge-coupled devices (CCD) image sensors. Compared to CCD image sensors, CMOS image sensors are increasingly favored due to low power consumption, a small size, fast data processing, a direct output of data, and low manufacturing cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips typically comprise a plurality of metal interconnect layers arranged along a front-side of a substrate. The plurality of metal interconnect layers are configured to electrical connect together devices (e.g., transistors) arranged within the substrate. Back-side illuminated CMOS image sensors (BSI-CIS) comprise image sensing elements arranged within a substrate in proximity to a back-side of the substrate, so that the image sensing elements are able to receive light along the back-side of the substrate. By receiving light along the back-side of the substrate, incident light does not traverse the plurality of metal interconnect layers, thereby increasing an optical efficiency of the image sensing elements.

Because BSI-CIS are configured to receive light along a back-side of a substrate, substrates having BSI-CIS are often placed within a packaging structure in a front-side down configuration that exposes the back-side of the substrate. Because the back-side of the substrate is exposed, bond pads are often arranged along the back-side of the substrate and are connected to small interconnect wires arranged in low-k dielectric materials that are soft and that have a weak adhesive force with adjacent dielectric layers. As the size of integrated chip components decreases, the size and strength of the small interconnect wires and surrounding low-k dielectric materials also decease, making an integrated chip susceptible to damage from bonding stress generated when a solder bump is formed on a bond pad. This problem is further aggravated in BSI-CIS, since the substrates used in BSI-CIS are often thinned down to increase optical efficiency of the image sensing devices. The bonding stress may reduce IC yield due to defects such as warping, bending, cracking, and/or peeling of bond pads or layers underlying the bond pads.

The present disclosure relates to an integrated chip having a via support structure underlying a bond pad, and an associated method of formation. The integrated chip comprises an image sensing element arranged within a substrate. A bond pad region extends through the substrate, at a location laterally offset from the image sensing element, to a first metal interconnect wire arranged within a dielectric structure located along a front-side of the substrate. A conductive bond pad is arranged within the bond pad region and contacts the first metal interconnect wire. A via support structure is arranged within the dielectric structure and comprises one or more vias separated from the conductive bond pad by the first metal interconnect wire. One or more additional vias are arranged within the dielectric structure at a location laterally offset from the bond pad region. The one or more vias have larger sizes than the one or more additional vias. The relatively large size of the one or more vias increases a metal pattern density below the bond pad region, allowing for a bonding force to be distributed over a larger metal area and thereby reducing integrated chip damage due to bonding stress.

Figure 1:
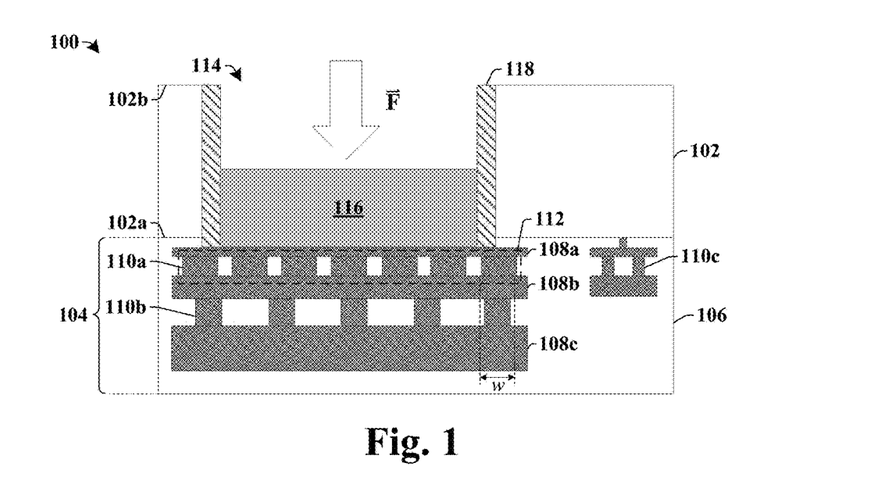
FIG. 1 illustrates a cross-sectional view of some embodiments of an integrated chip having a via support structure arranged below a bond pad.

FIG. 1 illustrates a cross-sectional view of some embodiments of an integrated chip 100 having a via support structure arranged below a conductive bond pad.

The integrated chip 100 comprises a back-end-of-the-line (BEOL) metallization stack 104 arranged along a first side 102a of a substrate 102 (e.g., a silicon substrate). The BEOL metallization stack 104 comprises a plurality of interconnect layers arranged within a dielectric structure 106. The plurality of interconnect layers alternate between interconnect wires 108a-108c and vias 110a-110c. The interconnect wires 108a-108c are configured to provide a lateral connection (i.e., a connection parallel to an upper surface of the substrate 102), while the vias 110a-110c are configured to provide for a vertical connection between adjacent interconnect wires 108a-108c.

A bond pad region 114 (i.e., a bond pad opening) extends through the substrate 102, from a second side 102b of the substrate 102 to a first interconnect wire 108a. In some embodiments, the first interconnect wire 108a is a closest interconnect wire to the substrate 102. In other embodiments, the first interconnect wire 108a may be separated from the substrate 102 by one or more additional interconnect wires (not shown). A conductive bond pad 116 is arranged within the bond pad region 114. The conductive bond pad 116 is in electrical contact with the first interconnect wire 108a. In some embodiments, one or more interior surfaces of the bond pad region 114 are lined with a dielectric layer 118. The dielectric layer 118 provides for electrical isolation between the conductive bond pad 116 and the substrate 102.

A via support structure 112 is arranged between the first interconnect wire 108a and an underlying second interconnect wire 108b at a location that is below the bond pad region 114. The via support structure 112 extends over a plurality of underlying vias 110b arranged below the second interconnect wire 108b. The via support structure 112 comprises one or more vias 110a and has a pattern density that is configured to mitigate damage caused by bonding stress generated by a force F of a bonding process on the conductive bond pad 116. In some embodiments, the pattern density of the via support structure 112 may be greater than or equal to approximately 19%. In some embodiments, the pattern density may be greater than or equal to approximately 40%.

In some embodiments, the pattern density of the via support structure 112 may be achieved by using vias 110a with a larger size in the via support structure 112 than in adjacent areas. For example, in some embodiments, the one or more vias 110a within the via support structure 112 have a size (e.g., a top surface area, a volume, etc.) that is larger than that of additional vias 110c within a same ILD layer outside of the via support structure 112 (i.e., vias on a same via design layer). In some embodiments, the one or more vias 110a within the via support structure 112 may have a size that is greater than approximately 130% a size of the additional vias 110c laterally outside of the via support structure 112. In some embodiments, the one or more vias 110a within the via support structure 112 may have a size of between 100% and 200% the size of additional vias 110c laterally outside of the via support structure 112. In some additional embodiments, the one or more vias 110a within the via support structure 112 may have a size of between 120% and 140% a size of vias 110c laterally outside of the via support structure 112.

The relatively large size of the one or more vias 110a within the via support structure 112 increases a pattern density below the first interconnect wire 108a (e.g., increases a ratio of metal area to dielectric area below the first interconnect wire 108a). The increased pattern density of the via support structure 112 allows for the force F of a bonding process to be distributed over a larger metal surface area, thereby reducing a force per unit area of metal. In other words, the relatively large metal pattern density of the via support structure 112 improves the transfer of force from a bonding process (e.g., a wire bond process or a flip-chip process) to the BEOL metallization stack 104, thereby limiting unwanted bonding stress on the interconnect layers. Reducing the bonding stress on the interconnect layers reduces damage to the integrated chip 100 (e.g., prevents the conductive bond pad 116 from peeling off of the underlying via support structure 112 during a wire pull test or a ball shear test) and improves bonding between the conductive bond pad 116 and underlying layers.

Figure 2:
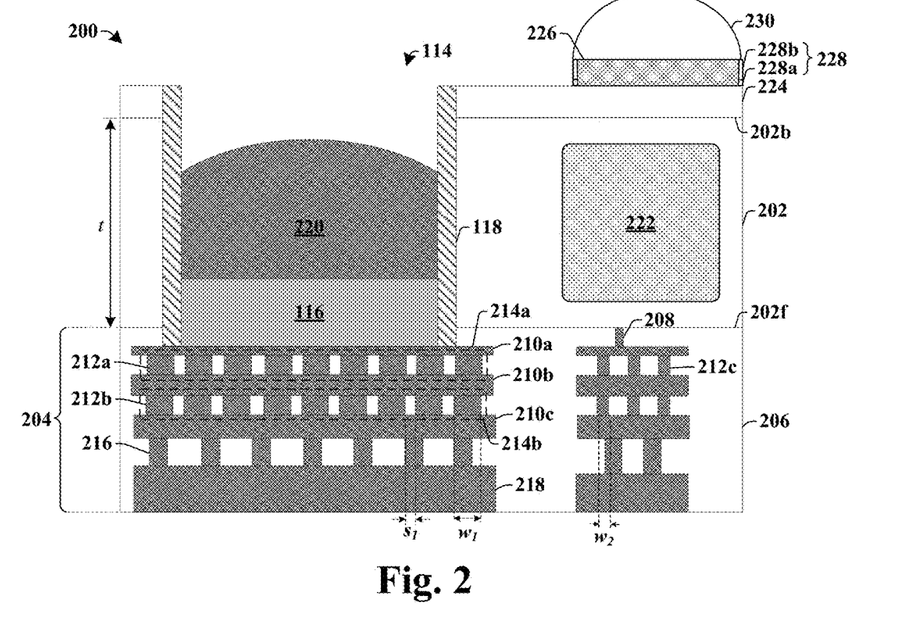
FIG. 2 illustrates a cross-sectional view of some embodiments of a back-side illuminated (BSI) image sensor chip having a via support structure arranged below a bond pad.

FIG. 2 illustrates a cross-sectional view of some embodiments of a back-side illuminated (BSI) image sensor chip 200 having a via support structure arranged below a bond pad.

The BSI image sensor chip 200 comprises a BEOL metallization stack 204 arranged along a front-side 202f of a substrate 202. The substrate 202 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the substrate 202 may have a thickness t that is less than that of a typical semiconductor wafer (e.g., a thickness of less than approximately 700 um). For example, in some embodiments, the thickness t may be in a range of between approximately 1 um and approximately 10 um.

The BEOL metallization stack 204 comprises a dielectric structure 206 having one or more stacked inter-level dielectric (ILD) layers. Alternating layers of metal wires and metal vias are arranged within the dielectric structure 206. The alternating layers of metal wires and metal vias increase in size as a distance from the substrate 202 increases. For example, in some embodiments, the BEOL metallization stack 204 comprises conductive contacts 208, a first plurality of metal interconnect wires 210a-210c, a first plurality of metal vias 212a-212c, a second plurality of metal vias 216a-216b larger than the additional metal vias 212c, and a second plurality of metal interconnect wires 218 larger than the first plurality of metal interconnect wires 210a-210c. In some embodiments, a first metal interconnect wire 210a may be smaller than metal interconnect wires 210b-210c. In some embodiments, the alternating layers of metal interconnect wires and metal vias may be in separate ILD layers. In some embodiments, adjacent layers of metal interconnect wires and metal vias may be in a shared ILD layer.

In various embodiments, the one or more stacked ILD layers may comprise an oxide, an ultra-low k dielectric material, and/or a low-k dielectric material (e.g., SiCO). In some embodiments, the conductive contacts may be arranged within a first ILD layer comprising a first material (e.g., PEOX), while the first metal interconnect wire 210a may be arranged within a second ILD layer comprising a second material different than the first material (e.g., an ultra low-k dielectric material). In various embodiments, the conductive contacts 208, the metal interconnect wires, 210a-210c and 218, and the metal vias, 212a-212c and 216a-216b, may comprise a metal such as copper, aluminum, tungsten, or other conductive materials such as conductive polymers or nanotubes, for example. In some embodiments, the conductive contacts 208, the metal interconnect wires, 210a-210c and 218, and the metal vias, 212a-212c and 216a-216b, may be separated from the dielectric structure 206 by a diffusion barrier layer (not shown).

A bond pad region 114 extends through the substrate 202 to a first metal interconnect wire 210a within the BEOL metallization stack 204. A conductive bond pad 116 is arranged within the bond pad region 114. The conductive bond pad 116 is electrically coupled to the first metal interconnect wire 210a. A conductive bump 220 is arranged over the conductive bond pad 116. In various embodiments, the conductive bump 220 may comprise nickel or zinc, for example. In some embodiments, the first metal interconnect wire 210a may comprise a solid metal layer having no openings arranged below the conductive bond pad 116. In other embodiments, the first metal interconnect wire 210a may comprise a slotted metal layer having one or more openings below the conductive bond pad 116.

One or more via support structures 214a-214b are separated from the conductive bond pad 116 by the first metal interconnect wire 210a. In some embodiments, the one or more via support structures 214a-214b may comprise a first via support structure 214a arranged between the first metal interconnect wire 210a and a second metal interconnect wire 210b and a second via support structure 214b arranged between the second metal interconnect wire 210b and a third metal interconnect wire 210c. In some embodiments, the one or more via support structures 214a-214b may be arranged between "thin" metal interconnect wires 210a-210c having a size below a predetermined width, but not between "thick" metal interconnect wires having sizes over the predetermined width. The one or more via support structures 214a-214b are vertically stacked onto one another. In some embodiments, the first via support structure 214a has one or more metal vias 212a arranged in a first pattern and the second via support structure 214b has one or more vias 212b arranged in a second pattern. In some embodiments, the first pattern may be substantially the same as the second pattern. In other embodiments, the first pattern may be different than the second pattern.

The one or more vias 212a-212b within the via support structures 214a-214b are configured to give the via support structures 214a-214b a metal pattern density that is greater than or equal to approximately 19%. The metal pattern density provides structural support to the overlying conductive bond pad 116. In some embodiments, the one or more via support structures 214a-214b may have a metal pattern density that is greater than or equal to 36%. In some additional embodiments, the one or more via support structures 214a-214b may have a metal pattern density that is greater than or equal to 40%. In some embodiments, the via support structures 214a-214b may have a metal pattern density greater than that of an array of additional metal vias 212c outside of the via support structures 214a-214b arranged at a minimum space and pitch allowed by design rules.

In some embodiments, the one or more vias 212a-212b within the one or more via support structures 214a-214b may have a size and/or shape that is different than the additional metal vias 212c laterally outside of the via support structures 214a-214b. The different size and/or shape of the vias 212a-212b within the via support structures 214a-214b is configured to give the via support structures 214a-214b the metal pattern density. In some embodiments, the vias 212a-212b within the via support structures 214a-214b may have an elongated shape with respect to the additional metal vias 212c. In some embodiments, the via support structures 214a-214b comprise vias 212a-212b having a first width $w_1$, while the additional metal vias 212c have a second width $w_2$ that is smaller than the first width $w_1$. In some embodiments, the vias 108a-108b within the via support structures 214a-214b may be separated by a first space $s_1$. In some embodiments, the first width $w_1$ may be larger than the first space $s_1$ (e.g., the first width $w_1$ may be twice the first space $s_1$). In other embodiments, the first width $w_1$ may be smaller than the first space $s_1$.

In some embodiments, the one or more vias 212a-212b within the one or more via support structures 214a-214b and the one or more additional metal vias 212c may have surfaces facing the substrate, which are substantially co-planar (e.g., co-planar within a tolerance of a chemical mechanical polishing tool). In some embodiments, the second plurality of metal vias 216a-216b may comprise a via array separated from the substrate 202 by the one or more via support structures 214a-214b. The second plurality of metal vias 216a within the via array have a same size as vias 216b laterally outside of the via array, so that the second plurality of metal vias 216a-216b have a substantially same size.

An image sensing element 222 is arranged within the substrate 202 at a location that is laterally offset from the bond pad region 114. The image sensing element 222 is configured to generate charge carriers (e.g., electron-hole pair) from incident radiation. In some embodiments, the image sensing element 222 may comprise a photodiode.

In some embodiments, one or more passivation layers 224 are arranged over a back-side 202b of the substrate 202. A color filter 226 is arranged over the one or more passivation layers 224. The color filter 226 is configured to transmit a specific wavelength of radiation. In some embodiments, the color filter 226 may be surrounded by a grid structure 228. In some embodiments, the grid structure 228 may comprise a stacked structure having a dielectric material 228a (e.g., silicon nitride) and an overlying metal 228b. The grid structure 228 forms a framework that defines an opening located over the underlying image sensing element 222. A micro-lens 230 is arranged over the color filter 226. The micro-lens 230 is aligned with the color filter 226. In some embodiments, the micro-lens 230 had a substantially flat bottom surface abutting the color filter 226, and a curved upper surface configured to focus incident radiation onto a center of the underlying image sensing element 222 to increase efficiency of the image sensing element 222.

Figure 3:
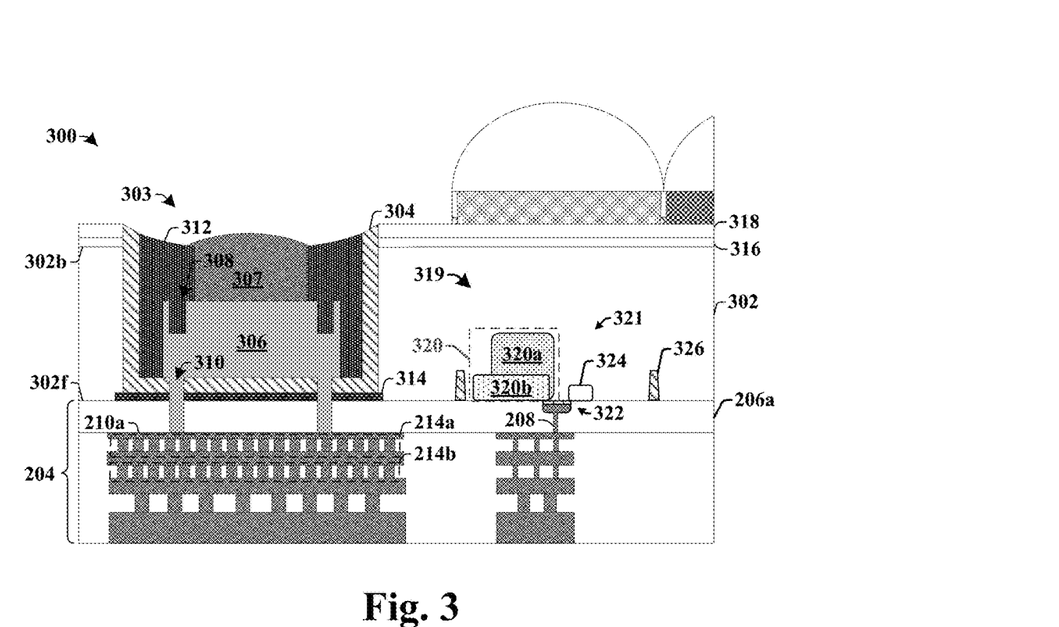
FIG. 3 illustrates a cross-sectional view of some additional embodiments of a BSI image sensor chip having a via support structure arranged below a bond pad.

FIG. 3 illustrates a cross-sectional view of some additional embodiments of a BSI image sensor chip 300 having a via support structure arranged below a bond pad.

The BSI image sensor chip 300 comprises a bond pad region 303 extending from a back-side 302b of a substrate 302 to a first metal interconnect wire 210a within a BEOL metallization stack 204 arranged along a front-side 302f of the substrate 302. A first passivation layer 304 lines sidewalls and a lower surface of the bond pad region 303. A bond pad 306 is arranged within the bond pad region 303. The bond pad 306 comprises a conductive material (e.g., a metal such as aluminum) and has an upper surface that is exposed by the bond pad region 303. In some embodiments, a dielectric filling layer 312 is arranged within the bond pad region 303 over the bond pad 306. The dielectric filling layer 312 may comprise oxide (e.g., silicon oxide). A conductive bump 307 may also be arranged over the bond pad 306.

In some embodiments, the bond pad 306 may comprise protrusions 310 extending vertically outward from a lower surface of the bond pad 306 to a location electrically contacting the first metal interconnect wire 210a. In some embodiments, the protrusions 310 may extend through a dielectric isolation layer 314 arranged along the front-side 302f of the substrate 302. The dielectric isolation layer 314 provides for improved isolation between the bond pad 306 and adjacent regions of the substrate 202. In some embodiment, the protrusions 310 may also extend through the first ILD layer 206a surrounding conductive contacts. In some embodiments, pad recesses 308 are arranged within an upper surface of the bond pad 306.

A pixel region 319 of a BSI-CIS is arranged within the substrate 302 at a location laterally offset from the bond pad region 303. In some embodiments, the pixel region 319 may be isolated from adjacent pixel regions (not shown) by one or more isolation structures 326 (e.g., shallow trench isolation regions) arranged on opposing sides of the pixel region 319. The one or more isolation structures 326 may comprise a dielectric material arranged within a trench in the front-side 302f of the substrate 302.

The pixel region 319 comprises a photodiode 320 configured to generate charge carriers (i.e., electron-hole pairs) from incident radiation. In some embodiments, the photodiode 320 may comprise a first region 320a with a first doping type (e.g., n-type doping) and a second region 320b with a second doping type (e.g., p-type doping) that is different than the first doping type. In some embodiments, the photodiode 320 may have regions with a doping concentration greater than or equal to approximately 5e15 atoms/cm$^3$. In some embodiments, the substrate 302 may have the second doping type.

A transfer transistor 321 comprising a transfer transistor gate 322 is arranged along the front-side 302f of the substrate 302. The transfer transistor gate 322 comprises a gate electrode separated from the substrate 302 by a gate dielectric layer. In some embodiments, sidewall spacers (not shown) are arranged on opposing sides of the gate dielectric layer and the gate electrode. The transfer transistor gate 322 is laterally arranged between the photodiode 320 and a source/drain region 324 (i.e., a floating diffusion node) and is configured to control the flow of the charge carriers from the photodiode 320 to the source/drain region 324. The source/drain region 324 is further coupled to a reset transistor and a source follower transistor (not shown). The reset transistor is configured to reset the photodiode 320 between exposure periods. If the charge level is sufficiently high within the source/drain region 324, the source follower transistor is activated and charges are selectively output according to operation of a row select transistor used for addressing.

A second passivation layer 316 is arranged onto a backside 302b of the substrate 302, and a layer of dielectric material 318 is arranged onto the second passivation layer 316. In some embodiments, the second passivation layer 316 may comprise an anti-reflective coating (ARC). In other embodiments, the second passivation layer 316 may comprise an organic polymer or a metallic oxide. In some embodiments, the layer of dielectric material 318 may comprise an oxide or high-k dielectric layer such as hafnium oxide (HfO), hafnium silicon oxide (HfSiO), hafnium aluminum oxide (HfAlO), or hafnium tantalum oxide (HfTaO), for example.

Figure 4:
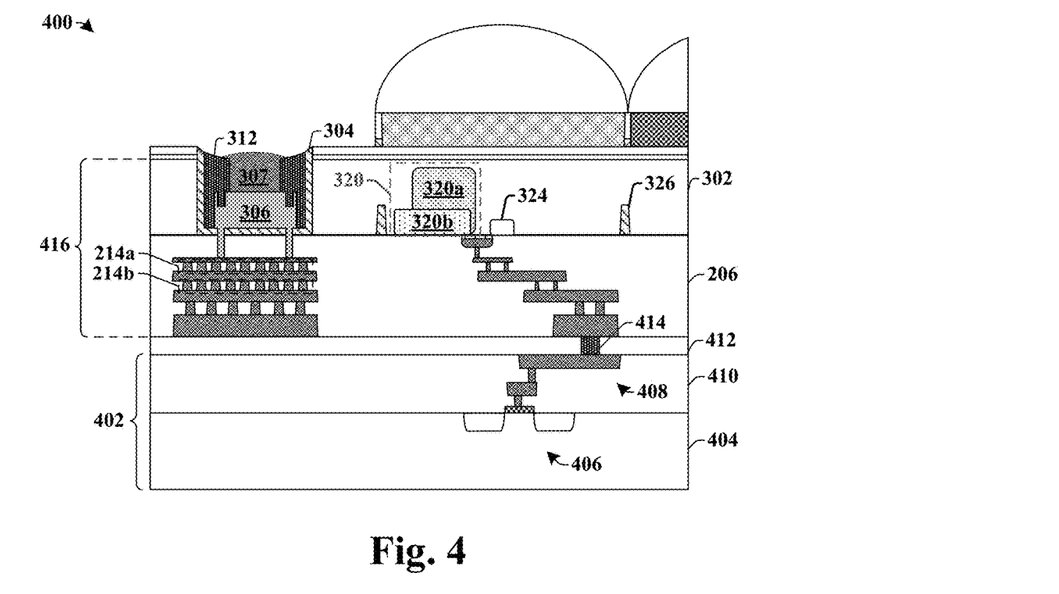
FIG. 4 illustrates a cross-sectional view of some embodiments of a BSI image sensor arranged within a three-dimensional integrated chip (3DIC) structure having tiers connected in a face-to-face configuration.

FIG. 4 illustrates a cross-sectional view of some embodiments of a three-dimensional integrated chip (3DIC) 400 comprising a BSI-CIS.

The 3DIC 400 comprises a first tier 416 and a second tier 402. The first tier 416 comprises a substrate 302 having a BSI-CIS, as described above in FIG. 3. The second tier 402 comprises a second substrate 404 and a dielectric structure 410 arranged along a front-side of the second substrate 404. One or more semiconductor devices 406 are arranged within the second substrate 404. In various embodiments, the one or more semiconductor devices 406 may comprise transistor devices and/or passive devices, for example. A plurality of metal interconnect layers 408 are arranged within the dielectric structure 410.

The second tier 402 is coupled to the first tier 416 in a face-to-face configuration, in which dielectric structures, 206 and 410, are arranged between substrate 302 and the second substrate 404. In some embodiments, the dielectric structures, 206 and 410, may be connected together by way of a bonding structure 412. In some such embodiments, an inter-tier interconnect structure 414 is configured to electrically couple the second tier 402 and the first tier 416. The inter-tier interconnect structure 414 extends from one of the plurality of metal interconnect layers 408, through the bonding structure 412, to a metal interconnect wire within dielectric structure 206. In other embodiments, dielectric structures, 206 and 410, may directly abut one another.

Although FIG. 4 illustrates a 3DIC as having a face-to-face configuration, it will be appreciated that the present disclosure is not limited to such 3DIC configurations. In other embodiments, the 3DIC may have a face-to-back configuration, for example.

Figure 5A:
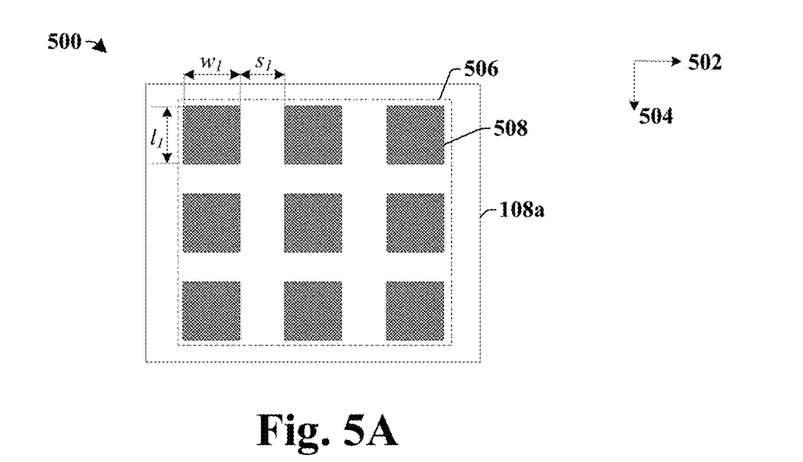
FIGS. 5A-5C illustrate top-views of various embodiments of via support structures arranged below a bond pad.
Figure 5B:
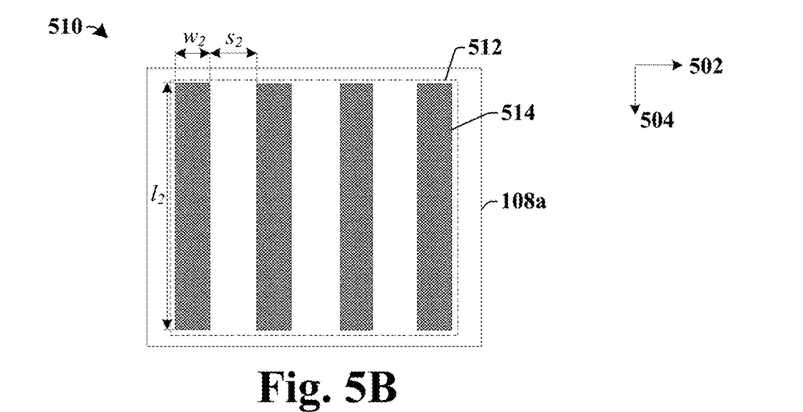
Figure 5C:
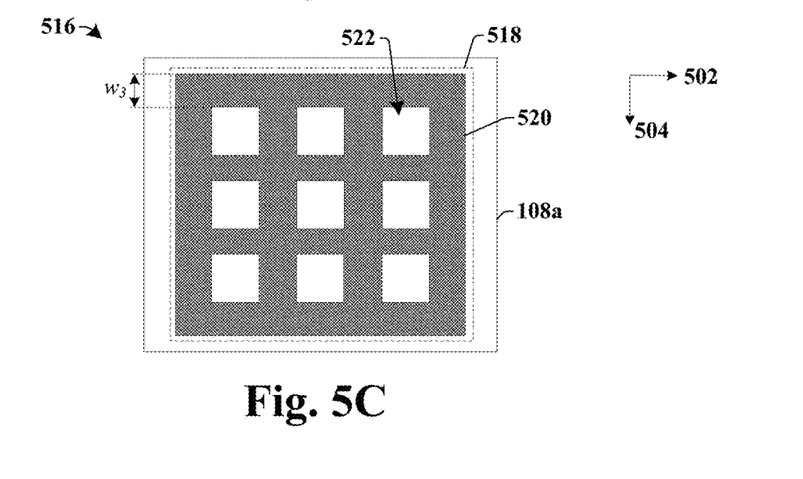

FIGS. 5A-5C illustrates top views of various embodiments of via support structures arranged below a first metal interconnect wire.

FIG. 5A illustrates a top-view 500 of some embodiments of a via support structure 506 comprising a plurality of vias 508 arranged below a first interconnect wire 108a. The plurality of vias 508 are arranged within the via support structure 506 in a substantially periodic pattern (i.e., within a pattern that is periodic within tolerance of a fabrication process). The plurality of vias 508 have lengths $l_1$ that are substantially equal to widths $w_1$, and are separated from one another by a space $s_1$ along a first direction 502 and a second direction 504. In some embodiments, the widths $w_1$ of the plurality of vias 508 are larger than the space $s_1$ between adjacent ones of the plurality of vias 508. In other embodiments, the widths $w_1$ of the plurality of vias 508 are smaller than the space $s_1$ between adjacent ones of the plurality of vias 508. Although the plurality of vias 508 are illustrated as being square, in other embodiments the plurality of vias 508 can be circular, rectangular, oval, or have other shapes.

In some embodiments, a ratio of the width $w_1$ to the space $s_1$ may be in a range of between approximately 0.75 and approximately 2 (e.g., $0.75<w_1/s_1<2$). In some embodiments, the plurality of vias 508 within the via support structure 506 may have a metal pattern density that is greater than or equal to approximately 19%. In some additional embodiments, the plurality of vias 508 within the via support structure 506 may have a metal pattern density greater than or equal to 37%. In some embodiments, the plurality of vias 508 within the via support structure 506 may have a metal pattern density less than 50% since a metal pattern density larger than 50% unexpectedly causes a bondability of a bond pad to decrease.

FIG. 5B illustrates a top-view 510 of some alternative embodiments of a via support structure 512 comprising a plurality of vias 514 arranged below a first interconnect wire 108a. The plurality of vias 514 have an elongated shape, having a width $w_2$ that extends along a first direction 502 and a length $l_2$ that extends along a second direction 504. In some embodiments, the plurality of vias 514 may have a length $l_2$ that is more than twice as large as the width $w_2$. For example, the plurality of vias 514 may have a length $l_2$ that is greater than three times the width $w_2$. The plurality of vias 514 are separated from one another along the first direction 502 by a space $s_2$. In some embodiments, the space $s_2$ may be less than or equal to the width $w_2$. In other embodiments, the space $s_2$ may be larger than the width $w_2$. In some embodiments, the plurality of vias 514 within the via support structure 512 may have a metal pattern density that is greater than or equal to approximately 19%. In some additional embodiments, the plurality of vias 514 may have a metal pattern density greater than 37%. In some additional embodiments, the plurality of vias 514 within the via support structure 512 may have a metal pattern density greater than 50%.

FIG. 5C illustrates a top-view 516 of some alternative embodiments of a via support structure 518 comprising a via 520 arranged below a first interconnect wire 108a. The via 520 contiguously extends in the first direction 502 and the second direction 504 around one or more openings 522 extending though the via 520. In some embodiments, the via 520 may have a width $w_3$ extending between an outer sidewall and a sidewall abutting the one or more openings 522. In some embodiments, the via 520 may have a metal pattern density that is greater than or equal to approximately 19%. In some additional embodiments, the via 520 may have a metal pattern density greater than 37%. In some embodiments, the via 520 may have a metal pattern density greater than 50%.

FIGS. 6-15 illustrate cross-sectional views corresponding to some embodiments of a method of forming an integrated chip having a via support structure arranged below a bond pad. It will be appreciated that elements in FIGS. 6-15 that have been described in previous embodiments have been designated with the same reference numbers for ease of understanding.

Figure 6:
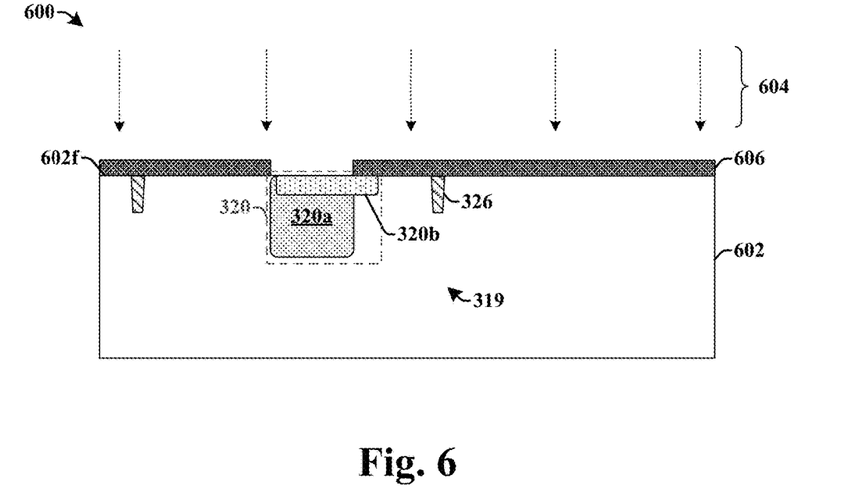
FIGS. 6-15 illustrate cross-sectional views corresponding to some embodiments of a method of forming an integrated chip having a via support structure arranged below a bond pad.

As shown in cross-sectional view 600 of FIG. 6, an image sensing element is formed within a pixel region 319 of a substrate 602. In some embodiments, the image sensing element may comprise a photodiode 320. In such embodiments, the photodiode 320 may be formed by selectively implanting the substrate 602 with one or more dopant species 604 to form doped regions 320a-320b within the substrate 602. For example, in some embodiments, a first implantation process is performed according to a first masking layer 606 (e.g., photoresist) arranged along a front-side 602f of the substrate 602 to form a first region 320a having a first doping type, and a second subsequent implantation process is performed according to a second masking layer (not shown) to form a second region 320b having a second doping type different than the first doping type.

In some embodiments, one or more isolation structures 326 (e.g., shallow trench isolation regions) may be formed within the front-side 602f of the substrate 602 on opposing sides of the pixel region 319. The one or more isolation structures 326 may be formed by selectively etching the front-side 602f of the substrate 602 to form shallow-trenches and subsequently forming a dielectric material (e.g., an oxide) within the shallow-trenches. In some embodiments, the one or more isolation structures 326 may be formed prior to formation of the photodiode 320.

Figure 7:
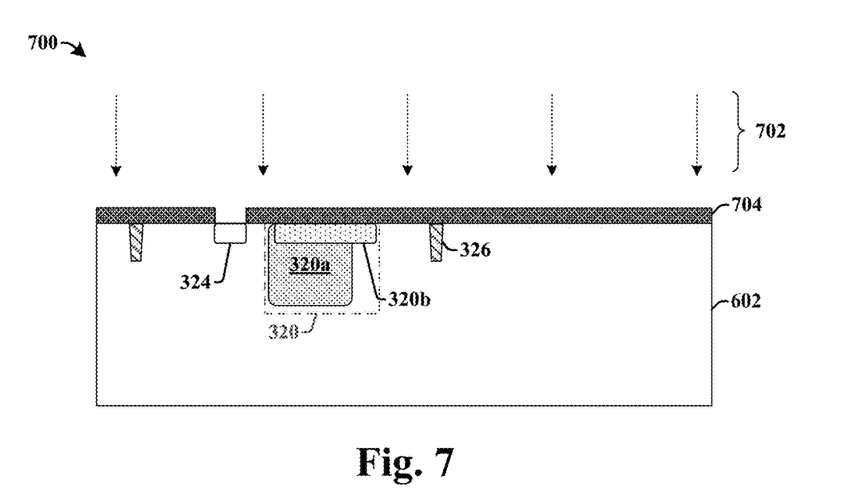

As shown in cross-sectional view 700 of FIG. 7, a source/drain region 324 is formed within the front-side 602f of the substrate 602. The source/drain region 324 may be formed by selectively implanting the substrate 602 with a dopant species 702 having the first doping type according to a first masking layer 704 (e.g., photoresist) arranged along a front-side 602f of the substrate 602.

Figure 8:
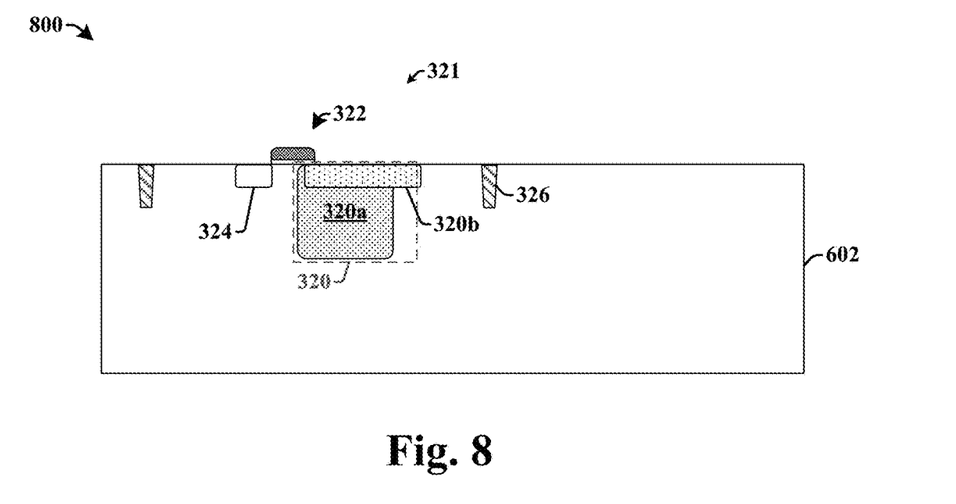

As shown in cross-sectional view 800 of FIG. 8, a transfer transistor gate 322 of a transfer transistor 321 is formed along the front-side 602f of the substrate 602 between the photodiode 320 and the source/drain region 324. The transfer transistor gate 322 may be formed by depositing a gate dielectric film and a gate electrode film over the substrate 602. The gate dielectric film and the gate electrode film are subsequently patterned to form a gate dielectric layer and a gate electrode.

Figure 9:
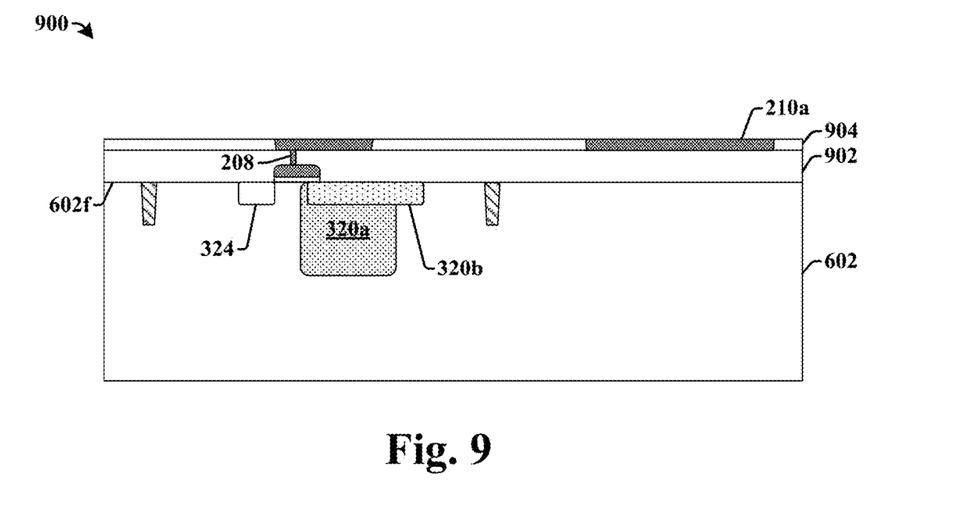

As shown in cross-sectional view 900 of FIG. 9, a first metal interconnect wire 210a is formed over the front-side 602f of the substrate 602. The first metal interconnect wire 210a is formed within a second ILD layer 904 overlying a first ILD layer 902 surrounding a plurality of conductive contacts. In some embodiments, the first metal interconnect wire 210a may be formed using a damascene process that forms and subsequently etches the second ILD layer 904 to form metal trenches, which are filled with a conductive material to form the first metal interconnect wire 210a. In some embodiments, the second ILD layer 904 may be deposited by a physical vapor deposition technique (e.g., PVD, CVD, etc.), while the conductive material may be formed using a deposition process and/or a plating process (e.g., electroplating, electro-less plating, etc.). In various embodiments, the conductive material may comprise tungsten, copper, or an aluminum-copper alloy, for example.

Figure 10:
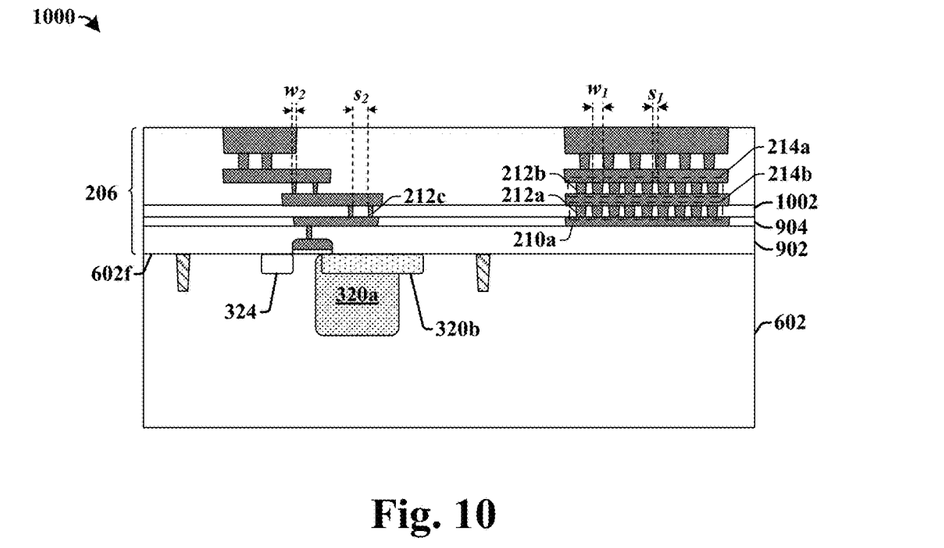

As shown in cross-sectional view 1000 of FIG. 10, a via support structure 214a, comprising one or more metal vias 212a, is formed within an ILD layer 1002 over the first metal interconnect wire 210a. One or more additional metal vias 212c may also be formed within the ILD layer 1002 at locations laterally offset from the via support structure 214a. The via support structure 214a has a pattern density that is greater than or equal to 19%. In some embodiments, the via support structure 214a may comprise a plurality of metal vias having a first width $w_1$, which are separate from one another by a first space $s_1$. In some embodiments, the first width $w_1$ may be larger than the first space $s_1$. In some embodiments, the one or more metal vias 212a may have a larger size (e.g., top surface area, volume, etc.) than the one or more additional metal vias 212c.

One or more additional metal interconnect layers are subsequently formed within ILD layers over the via support structure 214a, resulting in a dielectric structure 206 comprising a plurality of metal interconnect layers. In some embodiments, the one or more additional metal interconnect layers may comprise a second via support structure 214b. In some embodiments, the one or more metal vias 212a and the one or more additional metal vias 212c may be concurrently formed. In some embodiments, the one or more metal vias 212a, the one or more additional metal vias 212c, and the one or more additional metal interconnect layers may be formed by damascene processes (e.g., by a single damascene process or a dual damascene process).

Figure 11:
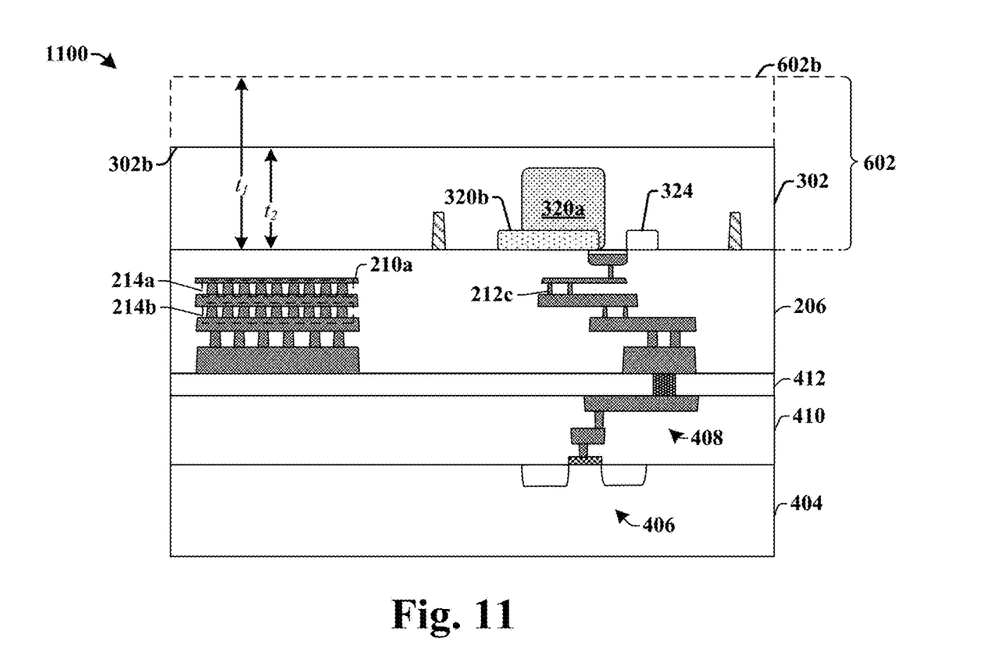

As shown in cross-sectional view 1100 of FIG. 11, the substrate 602 is thinned to form substrate 302. Thinning the substrate 602 reduces a thickness of the substrate 602 from a first thickness $t_1$ to a second thickness $t_2$. In some embodiments, the second thickness $t_2$ may be in a range of between approximately 1 um to approximately 10 um. Reducing the thickness improves transmission of radiation through the back-side 302b of the substrate 302 to the photodiode 320. In various embodiments, the substrate 602 may be thinned by etching or mechanically grinding the back-side 602b of the substrate 602.

In some embodiments, the dielectric structure 206 is bonded to a second substrate 404 prior to thinning. The second substrate 404 may comprise a CMOS substrate having one or more semiconductor devices 406 and a dielectric structure 410 comprising a plurality of metal interconnect layers 408. In other embodiments, the second substrate 404 may be a handle substrate (not shown). In some embodiments, the second substrate 404 may be bonded to the dielectric structure 206 by way of a bonding layer. In some embodiments, the bonding layer may comprise an intermediate bonding oxide layer (not shown). In some embodiments, the bonding process may comprise a fusion bonding process.

Figure 12:
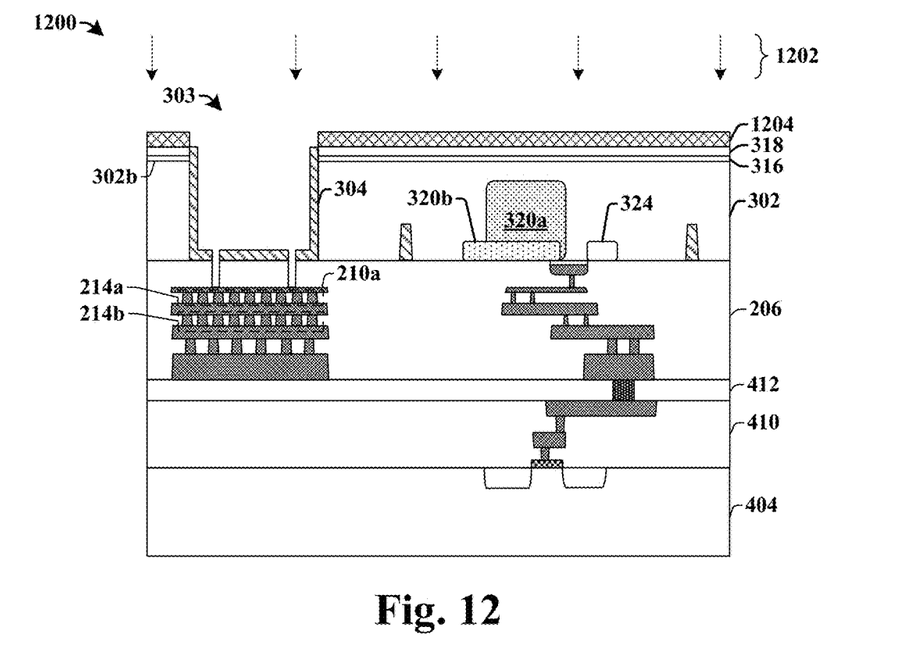

As shown in cross-sectional view 1200 of FIG. 12, a back-side of the substrate 302 may be selectively etched to form a bond pad region 303 (i.e., a bond pad opening) extending through the substrate 302. In some embodiments, the etching process may comprise a multi-step etching process. In some embodiments, the back-side 302b of the substrate 302 may be selectively exposed to an etchant 1202 according to a masking layer 1204. In various embodiments, the etchant 1202 may comprise a dry etchant (e.g., an RIE) and/or a wet etchant (e.g., Tetramethylammonium hydroxide (TMAH), potassium hydroxide (KOH), etc.). In some embodiments, a first passivation layer 304 is formed within the bond pad region 303. The first passivation layer 304 may comprise a dielectric layer deposited by way of a vapor deposition process (e.g., PVD, CVD, PE-CVD, etc.).

In some embodiments, a second passivation layer 316 and a layer of dielectric material 318 may be formed onto the back-side 302b of the substrate 302 prior to forming the bond pad region 303. In some embodiments, the second passivation layer 316 may comprise an anti-reflective coating (ARC) layer. The layer of dielectric material 318 may be formed over the second passivation layer 316. In some embodiments, the layer of dielectric material 318 may comprise an oxide. In some embodiments, the second passivation layer 316 and the layer of dielectric material 318 may be deposited by way of vapor deposition processes (e.g., CVD, PVD, PE-CVD, etc.).

Figure 13:
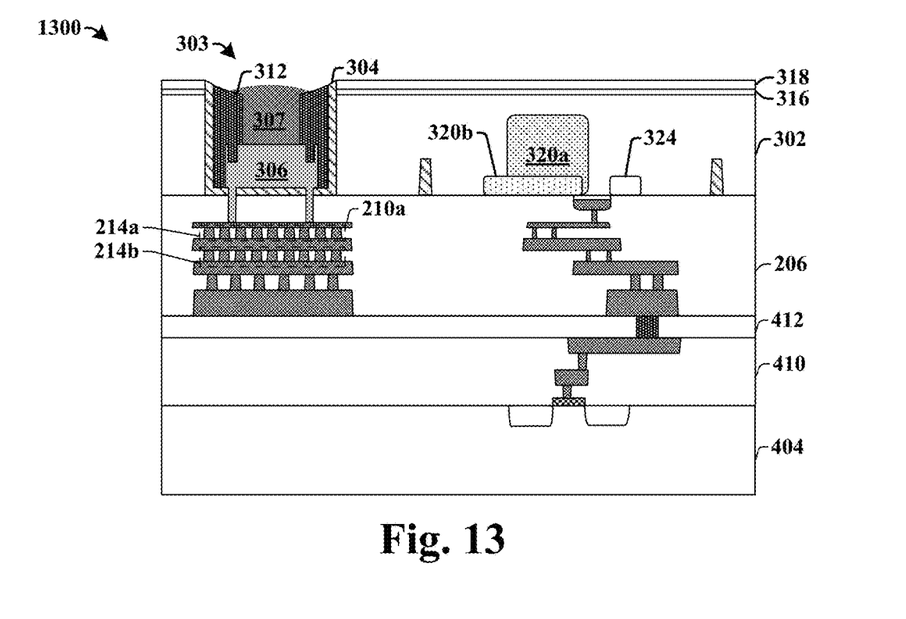

As shown in cross-sectional view 1300 of FIG. 13, a bond pad 306 is formed within the bond pad region 303 at a location overlying the first passivation layer 304. The bond pad 306 extends to a location that is in electrical contact with the first metal interconnect wire 210a. In some embodiments, a dielectric filling layer 312 is formed in the bond pad region 303 over the bond pad 306. The dielectric filling layer 312 may comprise oxide (e.g., silicon oxide) that covers a portion of the bond pad 306. A conductive bump 307 may be formed over the bond pad 306 during a subsequently bonding process (e.g., a wire bonding process, a flip chip bonding process, etc.).

Figure 14:
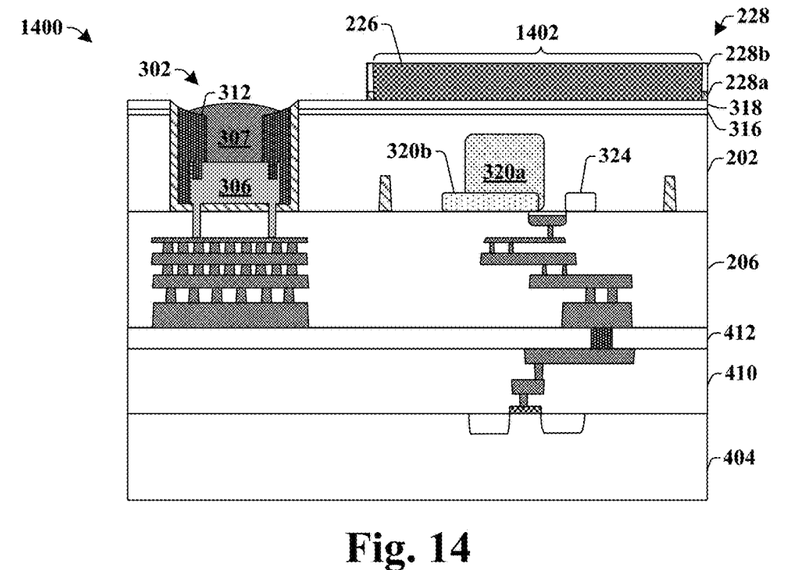

As shown in cross-sectional view 1400 of FIG. 14, a grid structure 228 is formed over the layer of dielectric material 318. In some embodiments, the grid structure 228 may be formed by forming a dielectric 228a (e.g., silicon-dioxide (SiO$_2$)) onto an upper surface of the layer of dielectric material 318 and a metal 228b over the dielectric 228a. The dielectric 228a may be formed using a deposition process. The metal 228b may be formed using a deposition process and/or a plating process (e.g., electroplating, electro-less plating, etc.). In various embodiments, the metal 228b may comprise tungsten, copper, or aluminum copper, for example. The dielectric 228a and the metal 228b are then etched to define an opening 1402 within the grid structure 228.

After forming the grid structure 228, a color filter 226 is formed to fill the opening 1402. In some embodiments, the color filter 226 may be formed by forming a color filter layer and patterning the color filter layer. The color filter layer is formed so as to fill exposed regions of the opening 1402. The color filter layer is formed of a material that allows for the transmission of radiation (e.g., light) having a specific range of wavelength, while blocking light of wavelengths outside of the specified range. The patterning may be performed by forming a photoresist layer with a pattern over the color filter layer, applying an etchant to the color filter layer according to the pattern of the photoresist layer, and removing the pattern photoresist layer. In some embodiments, the color filter layer is planarized subsequent to formation.

Figure 15:
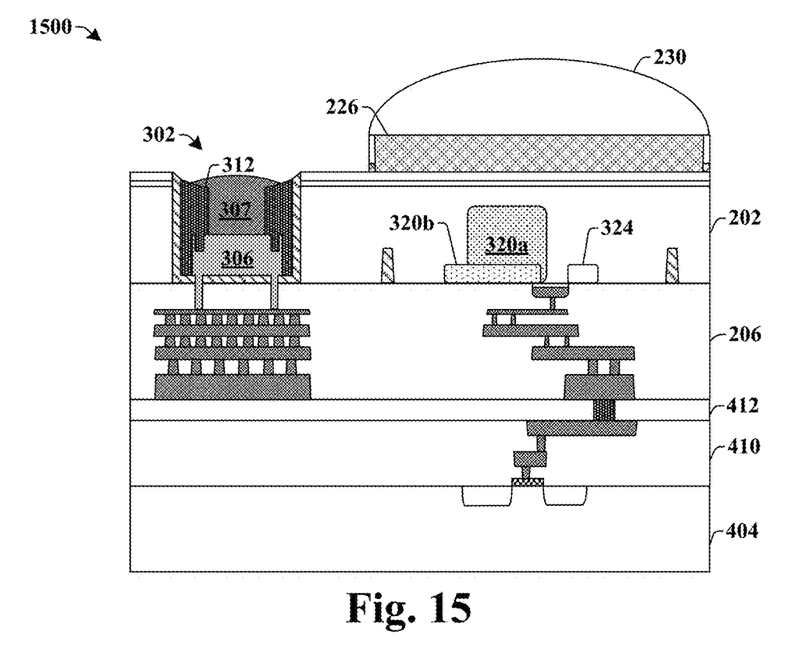

As shown in cross-sectional view 1500 of FIG. 15, a micro-lens 230 is formed over the color filter 226. In some embodiments, the micro-lens 230 may be formed by depositing a micro-lens material above the color filter 226 (e.g., by a spin-on method or a deposition process). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The micro-lens 230 is then formed by selectively etching the micro-lens material according to the micro-lens template.

Figure 16:
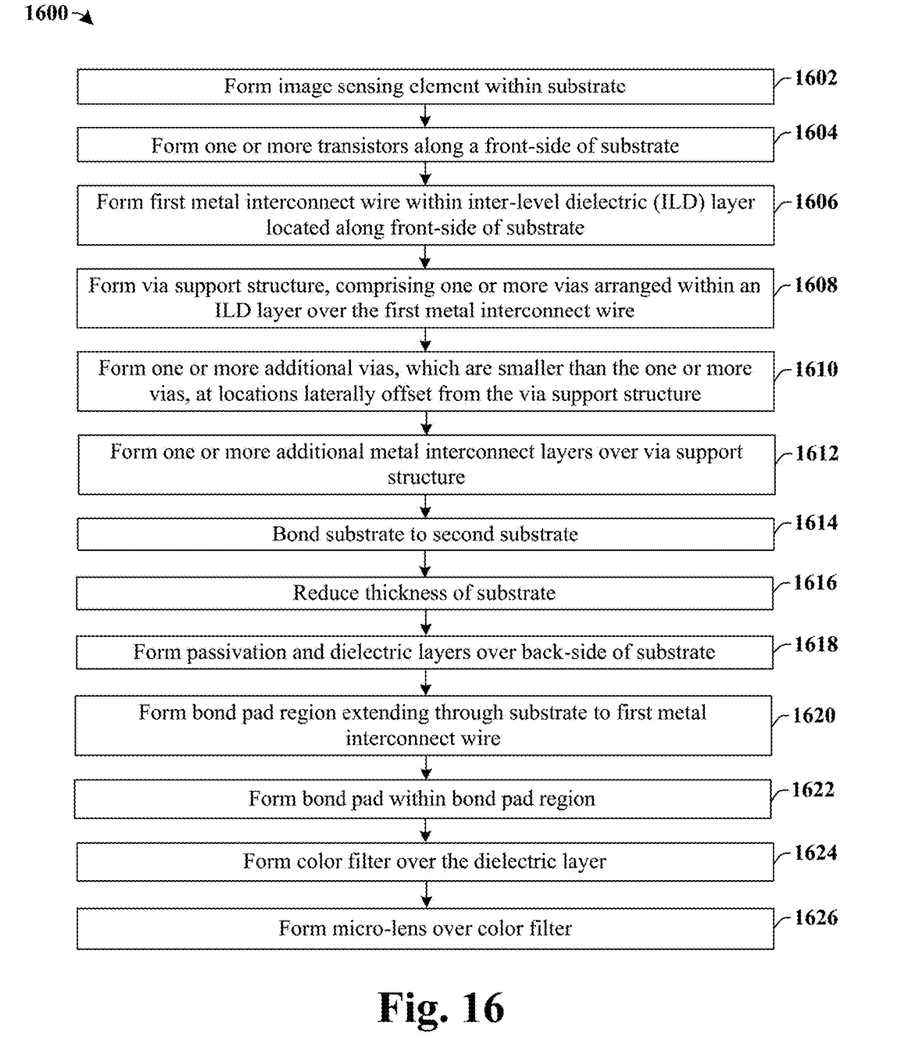
FIG. 16 illustrates a flow diagram of some embodiments of a method of forming an integrated chip having a via support structure arranged below a bond pad.

FIG. 16 illustrates a flow diagram of some embodiments of a method 1600 of forming an integrated chip having a via support structure arranged below a bond pad.

While the disclosed method 1600 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1602, an image sensing element is formed within a substrate. In some embodiments, the image sensing element comprises a photodiode formed by performing one or more implantation processes within a front-side of the substrate. FIG. 6 illustrates some embodiments of a cross-sectional view 600 corresponding to act 1602.

At 1604, one or more transistors are formed along the front-side of the substrate. In some embodiments, the one or more transistors may comprise one or more of a transfer transistor, a reset transistor, and/or a source/follower transistor of a CMOS image sensor. FIGS. 7-8 illustrate some embodiments of cross-sectional views 700-800 corresponding to act 1604.

At 1606, a first metal interconnect wire is formed within an inter-level dielectric (ILD) layer located along a front-side of the substrate. FIG. 9 illustrates some embodiments of a cross-sectional view 900 corresponding to act 1606.

At 1608, a via support structure, comprising one or more vias arranged over the first metal interconnect wire, is formed within an ILD layer overlying the first metal interconnect wire. FIG. 10 illustrates some embodiments of a cross-sectional view 1000 corresponding to act 1608.

At 1610, one or more additional vias are formed at locations laterally offset from the via support structure, in some embodiments. The one or more additional vias are smaller than the one or more vias within the via support structure. In some embodiments, the one or more vias within the via support structure and the one or more additional vias may be concurrently formed. FIG. 10 illustrates some embodiments of a cross-sectional view 1000 corresponding to act 1610.

At 1612, one or more additional metal interconnect layers are formed over the via support structure. FIG. 10 illustrates some embodiments of a cross-sectional view 1000 corresponding to act 1612.

At 1614, the substrate may be bonded to a second substrate, in some embodiments. In some embodiments, the first substrate may be indirectly bonded to the second substrate by way of one or more intervening ILD layers. FIG. 11 illustrates some embodiments of a cross-sectional view 1100 corresponding to act 1614.

At 1616, a thickness of the substrate is reduced. FIG. 11 illustrates some embodiments of a cross-sectional view 1100 corresponding to act 1616.

At 1618, a passivation layer and a layer of dielectric material may be formed over a back-side of the substrate, in some embodiments. FIG. 12 illustrates some embodiments corresponding to act 1618.

At 1620, a bond pad region is formed. The bond pad region extends through the substrate, from the back-side of the substrate to the first metal interconnect wire. FIG. 12 illustrates some embodiments of a cross-sectional view 1200 corresponding to act 1620.

At 1622, a bond pad is formed within the bond pad region. FIG. 13 illustrates some embodiments of a cross-sectional view 1300 corresponding to act 1622.

At 1624, a color filter is formed over the layer of dielectric material. FIG. 14 illustrates some embodiments of a cross-sectional view 1400 corresponding to act 1624.

At 1626, a micro-lens is formed over the color filter. FIG. 15 illustrates some embodiments of a cross-sectional view 1500 corresponding to act 1626.

Therefore, the present disclosure relates to an integrated chip having a via support structure underlying a bond pad, and an associated method of formation.

In some embodiments, the present disclosure relates to an integrated chip. The integrated chip comprises an image sensing element arranged within a substrate. A bond pad region extends through the substrate, from a back-side of the substrate to a first metal interconnect wire arranged within a dielectric structure located along a front-side of the substrate. A conductive bond pad is arranged within the bond pad region and contacts the first metal interconnect wire. A via support structure is arranged within the dielectric structure and comprises one or more vias separated from the conductive bond pad by the first metal interconnect wire. One or more additional vias are arranged within the dielectric structure at a location laterally offset from the bond pad region. The one or more vias have larger sizes than the one or more additional vias.

In other embodiments, the present disclosure relates to an integrated chip. The integrated chip comprises a bond pad arranged within a bond pad region. The bond pad region extends from a back-side of the substrate to a first metal interconnect wire arranged within a dielectric structure located along a front-side of the substrate. A via support structure comprising one or more vias is arranged within the dielectric structure at a location separated from the substrate by the first metal interconnect wire. The via support structure has a metal pattern density that is greater than or equal to approximately 40%.

In yet other embodiments, the present disclosure relates to a method of forming an integrated chip. The method comprises forming one or more transistors along a front-side of a substrate. The method further comprises forming a first metal interconnect wire within a first inter-level dielectric (ILD) layer located along the front-side of the substrate. The method further comprises forming a via support structure, comprising one or more vias arranged below the first metal interconnect wire, within a second ILD layer separated from the substrate by the first ILD layer. The method further comprises forming one or more additional vias within the second ILD layer, wherein the one or more vias have a larger size than the one or more additional vias. The method further comprises reducing a thickness of the substrate, and forming a bond pad region over the via support structure, wherein the bond pad region extends through the substrate to the first metal interconnect wire. The method further comprises forming a bond pad within the bond pad region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
    an image sensing element arranged within a semiconductor substrate, wherein the semiconductor substrate comprises sidewalls defining a bond pad opening extending through the semiconductor substrate, wherein the bond pad opening extends from a back-side of the semiconductor substrate to a first metal interconnect wire arranged within a dielectric structure located along a front-side of the semiconductor substrate;
    a conductive bond pad arranged within the bond pad opening and contacting the first metal interconnect wire;
    a via support structure arranged within the dielectric structure and comprising one or more vias separated from the conductive bond pad by the first metal interconnect wire; and
    one or more additional vias arranged within the dielectric structure at a location laterally offset from the bond pad opening, wherein the one or more vias have larger sizes than the one or more additional vias.

2. The integrated chip of claim 1, wherein the one or more vias and the one or more additional vias have lower surfaces facing the substrate, which are substantially co-planar.

3. The integrated chip of claim 1,
    wherein the one or more vias respectively have a first size that is greater than approximately 130% a second size of respective ones of the one or more additional vias; and wherein the first size is configured to provide for a pattern density that mitigates damage caused by a force of a bonding process on the conductive bond pad.

4. The integrated chip of claim 1, wherein the one or more vias respectively have a width having a first size and are separated by a space having a second size that is less than the width.

5. The integrated chip of claim 1, wherein the via support structure has a metal pattern density that is greater than or equal to approximately 19%.

6. The integrated chip of claim 1, wherein the via support structure has a metal pattern density that is greater than or equal to approximately 40%.

7. The integrated chip of claim 1,
wherein the one or more vias have a length extending in a first direction and a width extending in a second direction that is perpendicular to the first direction; and
wherein the length is larger than the width.

8. The integrated chip of claim 7, wherein the length is more than twice as large as the width.

9. The integrated chip of claim 1, wherein the one or more vias respectively comprise sidewalls continuously surrounding one or more openings extending through a via.

10. The integrated chip of claim 1, further comprising:
a via array comprising a first plurality of vias arranged below the via support structure; and
a second plurality of vias arranged at a second location laterally offset from the bond pad opening, wherein the second plurality of vias have a same size as the first plurality of vias.

11. The integrated chip of claim 1, further comprising:
a plurality of conductive contacts arranged within a first ILD layer disposed between the first metal interconnect wire and the semiconductor substrate, wherein the bond pad opening extends through the first ILD layer.

12. An integrated chip, comprising:
a substrate;
a bond pad arranged within a bond pad region extending through the substrate, wherein the bond pad region extends from a back-side of the substrate to a first metal interconnect wire arranged within a dielectric structure located along a front-side of the substrate; and
a via support structure comprising one or more vias arranged within the dielectric structure at a location separated from the substrate by the first metal interconnect wire, wherein the via support structure has a metal pattern density that is greater than or equal to approximately 40% and that is configured to mitigate damage caused by a force of a bonding process on the bond pad.

13. The integrated chip of claim 12, wherein the one or more vias respectively have a width and are separated by a space that is smaller than the width.

14. The integrated chip of claim 12,
wherein the one or more vias have a length extending in a first direction and a width extending in a second direction that is perpendicular to the first direction; and
wherein the length is larger than the width.

15. The integrated chip of claim 12, wherein the one or more vias comprise a first via having sidewalls continuously surrounding one or more openings extending through the first via.

16. The integrated chip of claim 12, further comprising:
one or more additional vias having lower surfaces facing the substrate, which are substantially co-planar with lower surfaces of the one or more vias facing the substrate, wherein the one or more additional vias are smaller than the one or more vias.

17. An integrated chip, comprising:
a substrate having interior sidewalls defining an opening extending from a front-side of the substrate to a back-side of the substrate;
a dielectric structure disposed along the front-side of the substrate;
a bond pad extending from between the interior sidewalls to a first interconnect layer surrounded by the dielectric structure;
a plurality of support vias between the first interconnect layer and a second interconnect layer surrounded by the dielectric structure; and
one or more additional vias surrounded by the dielectric structure and having a smaller width than the plurality of support vias, wherein a horizontal plane parallel to the front-side of the substrate extends through the plurality of support vias and the one or more additional vias, and wherein the plurality of support vias extend from under the bond pad to laterally outside of the bond pad.

18. The integrated chip of claim 17, wherein the plurality of support vias are confined between interconnect layers intersecting a vertical projection of the bond pad.

19. The integrated chip of claim 17, wherein the first interconnect layer has a first surface contacting the bond pad and an opposing, second surface contacting the plurality of support vias.

20. The integrated chip of claim 17, wherein the plurality of support vias have heights that are substantially equal to heights of the one or more additional vias.

* * * * *